United States Patent
Lin et al.

(10) Patent No.: US 10,971,045 B2
(45) Date of Patent: Apr. 6, 2021

(54) DISPLAY APPARATUS

(71) Applicant: Au Optronics Corporation, Hsinchu (TW)

(72) Inventors: Chun-Feng Lin, Taichung (TW); Chuang-Cheng Yang, Changhua County (TW); Ming-Hsien Lee, Hsinchu (TW); Yi-Cheng Lin, New Taipei (TW); Wei-Chia Chiu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/441,018

(22) Filed: Jun. 14, 2019

(65) Prior Publication Data
US 2020/0211433 A1    Jul. 2, 2020

(30) Foreign Application Priority Data
Dec. 27, 2018 (TW) .................................. 107147303

(51) Int. Cl.
*G09G 3/20* (2006.01)
(52) U.S. Cl.
CPC ........... *G09G 3/20* (2013.01); *G09G 2300/08* (2013.01); *G09G 2310/0267* (2013.01); *G09G 2310/0286* (2013.01)
(58) Field of Classification Search
CPC ................ G09G 3/20; G09G 2300/08; G09G 2310/0267; G09G 2310/0286
See application file for complete search history.

(56) References Cited

U.S. PATENT DOCUMENTS

| | | | |
|---|---|---|---|
| 9,633,620 B2 | 4/2017 | Cao | |
| 2008/0123002 A1* | 5/2008 | Yeh | G09G 3/3659 349/37 |
| 2012/0154262 A1* | 6/2012 | Yamauchi | G09G 3/3659 345/100 |
| 2014/0111506 A1* | 4/2014 | Zhang | G09G 3/20 345/215 |
| 2016/0343335 A1* | 11/2016 | Cao | G09G 3/36 |
| 2018/0301106 A1* | 10/2018 | Huang | G09G 3/3688 |

FOREIGN PATENT DOCUMENTS

| | | |
|---|---|---|
| CN | 102498509 | 6/2012 |
| CN | 103474017 | 12/2013 |
| CN | 104505048 | 4/2015 |
| CN | 104698646 | 6/2015 |

\* cited by examiner

*Primary Examiner* — Amare Mengistu
*Assistant Examiner* — Jennifer L Zubajlo
(74) *Attorney, Agent, or Firm* — JCIPRNET

(57) ABSTRACT

A display apparatus includes a pixel array, a plurality of gate lines and a plurality of de-load lines. The pixel array includes a plurality of display rows, each of the display rows includes a plurality of pixel circuits, and each of the pixel circuits includes a first transistor and a second transistor coupled in series between a data line and a display pixel. A control end of the first transistor of each of the pixel circuits is coupled to one of the gate lines for receiving a gate driving signal. A control end of the second transistor of each of the pixel circuits is coupled to one of the de-load lines for receiving a de-loading signal. Where an enable time period of the de-loading signal received by each of the pixel circuits covers an enable time period of the gate driving signal received by each of the pixel circuits.

15 Claims, 9 Drawing Sheets

DISPLAY APPARATUS

CROSS-REFERENCE TO RELATED APPLICATION

This application claims the priority benefit of Taiwan application serial no. 107147303, filed on Dec. 27, 2018. The entirety of the above-mentioned patent application is hereby incorporated by reference herein and made a part of this specification.

TECHNICAL FIELD

The invention is related to a display apparatus, and particularly to a display apparatus having high-definition.

DESCRIPTION OF RELATED ART

In an Ultra High Definition (UHD) display apparatus, owing to an enhancement of definition or update rate of the display, a pixel charging time may be insufficient. Please refer to FIG. 1A and FIG. 1B, where a waveform diagram of a display apparatus of a conventional UHD is illustrated in FIG. 1A, and a schematic diagram of a display apparatus of a conventional UHD is illustrated in FIG. 1B. Under the structure of a Half Source driving (HSD), each of the pixel circuits 110 of a display apparatus 100 has transistors T1 and T2. Both of the transistors T1 and T2 are controlled by a gate driving signal SG1_O on a gate line G1_O, and display data on a source line S1 are transmitted to the corresponding pixel. Based on the parasitic capacitor effect on the transistors T1 and T2 on a gate, enable time periods of gate driving signals SG1_O and SG1_E (as illustrated in FIG. 1A, the gate driving signals SG1_O and SG1_E being high voltage time periods) are reduced to a certain degree. As such, under the UHD display requirements, the pixel charging time may be insufficient, which affects the display quality.

SUMMARY OF INVENTION

A display apparatus of the invention is provided. Under the condition of a high-definition display, a load effect caused by a parasitic capacitance on a thin-film transistor gate is effectively reduced.

A display apparatus of the invention includes a pixel array, a plurality of gate lines and a plurality of de-loading lines. The pixel array includes a plurality of display rows, each of the display rows includes a plurality of pixel circuits, and each of the pixel circuits includes a first transistor and a second transistor coupled in series between a data line and a display pixel. A control end of the first transistor of each of the pixel circuits is coupled to one of the gate lines for receiving a gate driving signal. A control end of the second transistor of each of the pixel circuits is coupled to one of the de-loading lines for receiving a de-loading signal. Where an enable time period of the de-loading signal received by each of the pixel circuits covers an enable time period of the gate driving signal received by each of the pixel circuits.

Based on the above, in the invention, the second transistor in each of the pixel circuits is conducted first before a charging operation is performed by each of the pixel circuits through the de-loading signal. As such, when each of the pixel circuits performs the charging operation, the parasitic capacitance effect on the gate driving signal to be driven by the gate driving line is reduced, so that the charging operation of each of the pixel circuits may be effectively completed.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
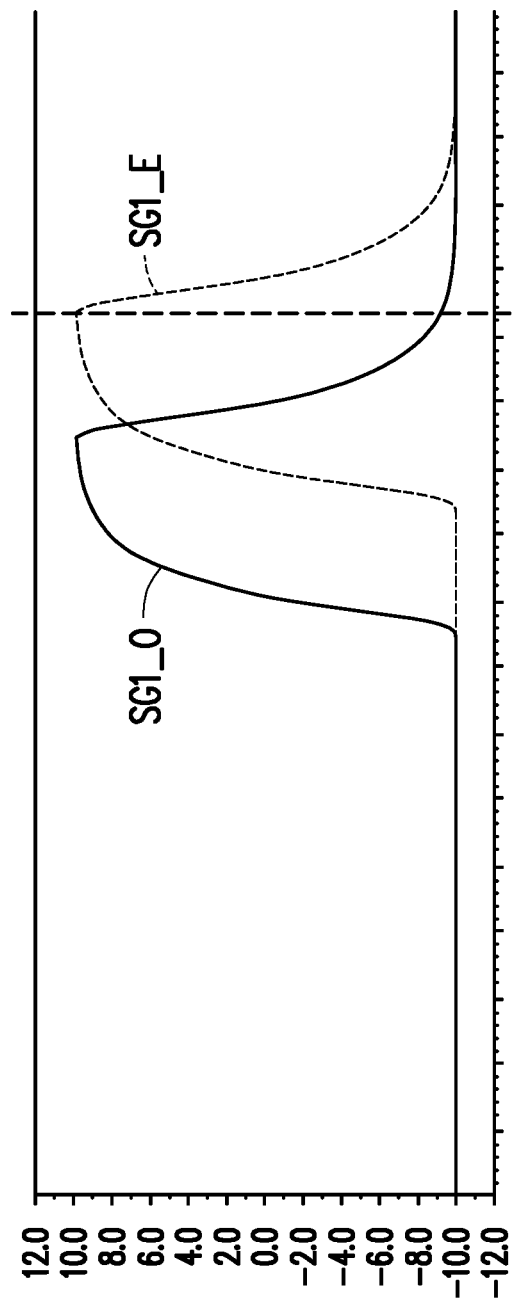
FIG. 1A illustrates a waveform diagram of a display apparatus of a conventional UHD.
Figure 1B:
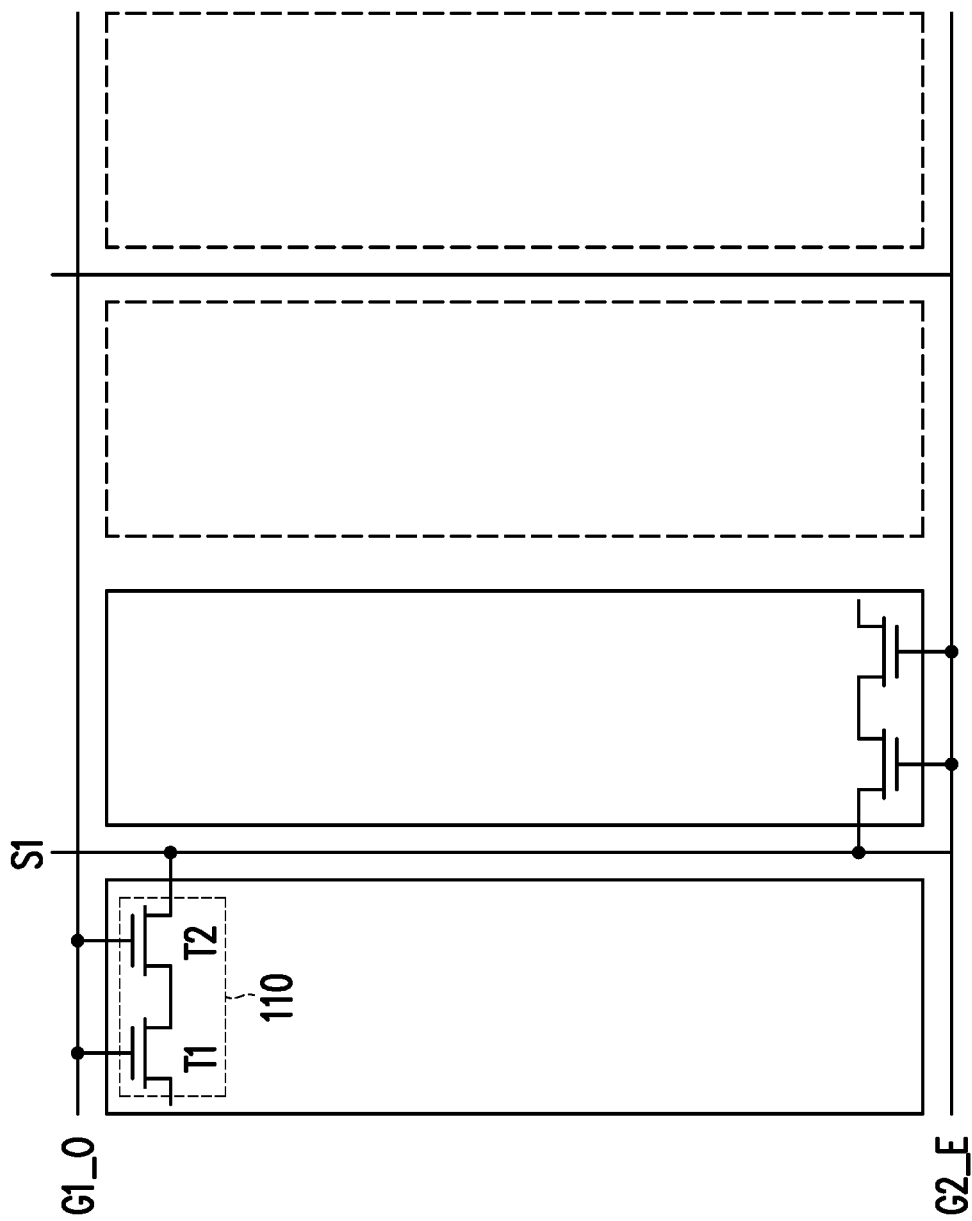
FIG. 1B illustrates a schematic diagram of a display apparatus of a conventional UHD.
Figure 2:
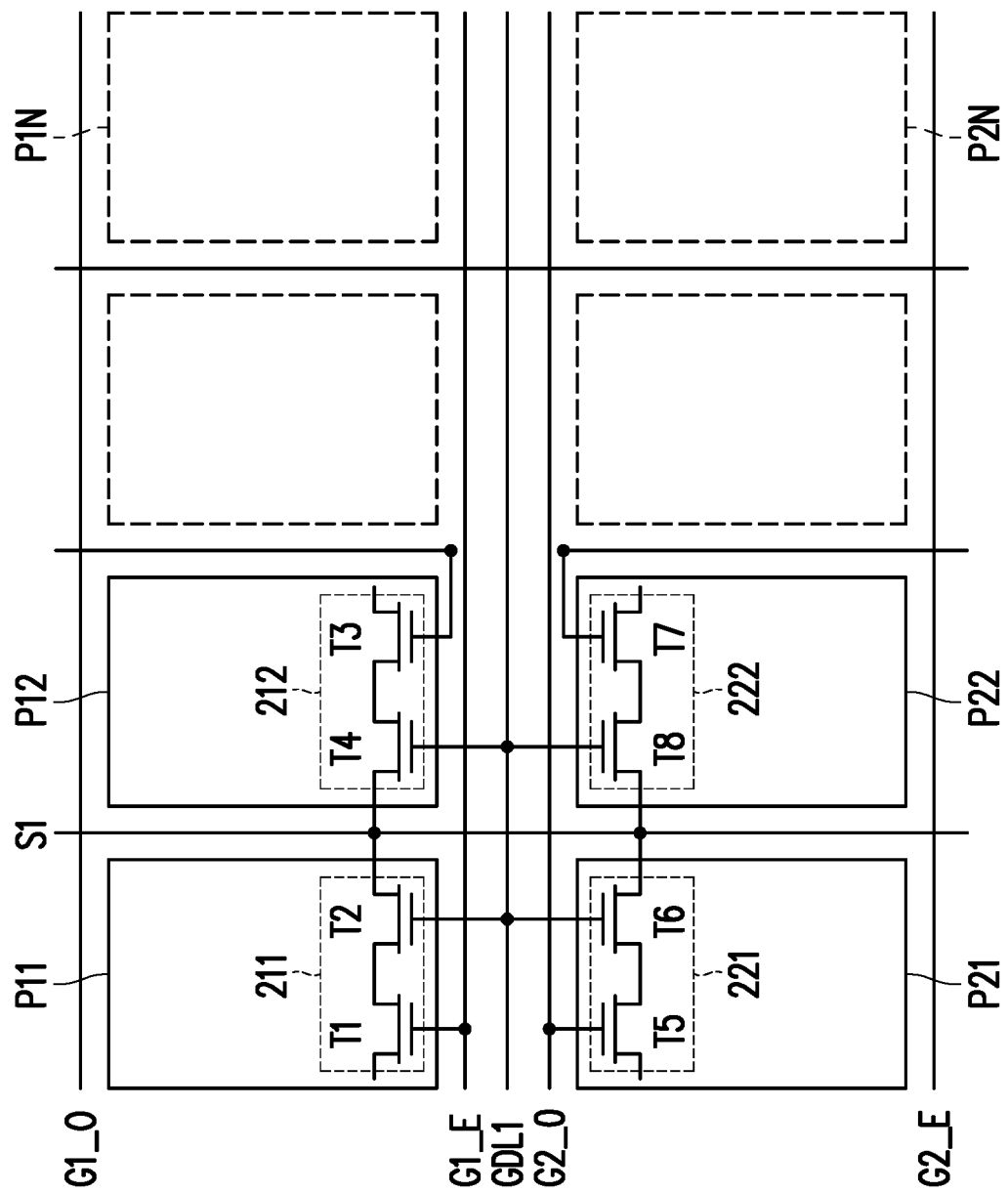
FIG. 2 illustrates a schematic diagram of a display apparatus of an embodiment of the invention.

Please refer to FIG. 2. FIG. 2 is a schematic diagram of a display apparatus of an embodiment of the invention. A display apparatus 200 includes a pixel array consisting of pixels P11-P2N, gate lines G1_O, G1_E, G2_O, G2_E, and a de-loading line GDL1. Take the pixels P11, P12, P21, P22 as examples. The pixels P11, P12, P21, P22 respectively have pixel circuits 211, 212, 221, and 222. In addition, the pixels P11-P1N form one display row, and the pixels P21-P2N form another display row. The pixel circuit 211 includes transistors T1, T2. The pixel circuit 212 includes transistors T3, T4. The pixel circuit 221 includes transistors T5, T6. The pixel circuit 222 includes transistors T7, T8. In this embodiment, take the pixel P11 as an example. The transistors T1, T2 in the pixel circuit 211 are coupled in series between a data line S1 and a display pixel (not illustrated). In addition, a control end (gate) of the transistor T1 is coupled to a gate line G1_E to receive the corresponding gate driving signal. A control end (gate) of the transistor T2 is coupled to the de-loading line GDL1 to receive the corresponding de-loading signal. It should be noted that an enable time period of the de-loading signal received by the pixel circuit 211 covers an enable time period of the gate driving signal.

Figure 3:
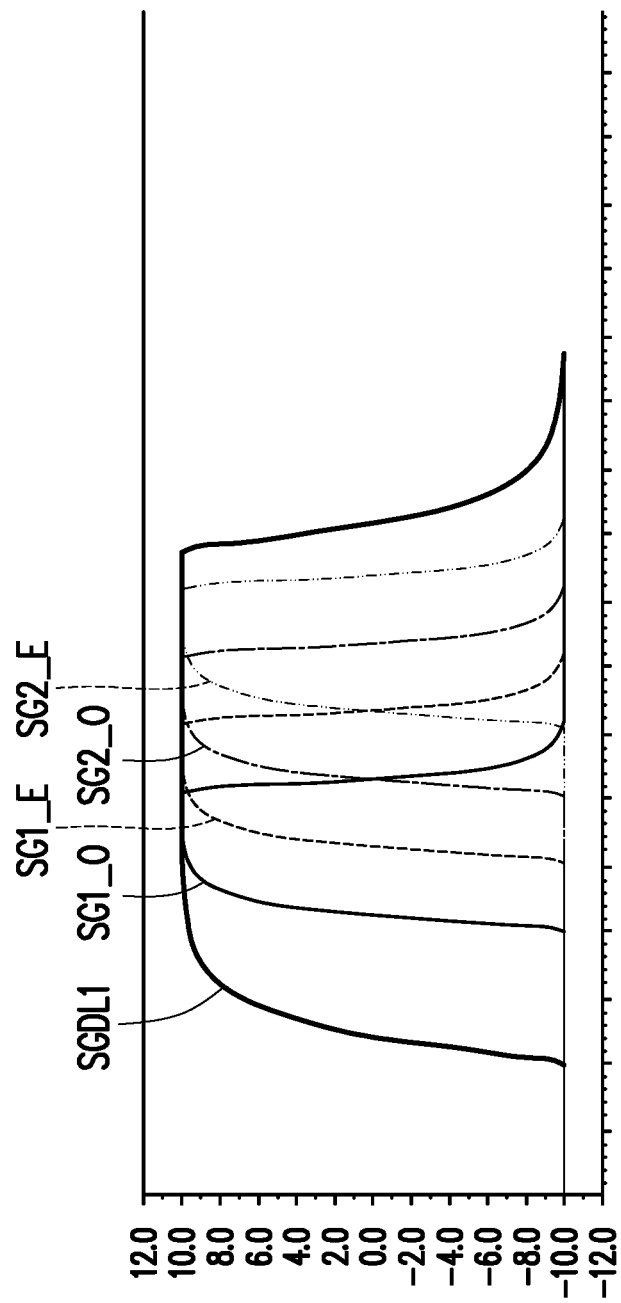
FIG. 3 illustrates a diagram of operation waveforms of the display device of the embodiment of the present invention.

Please refer to FIG. 2 and FIG. 3 at the same time, where FIG. 3 illustrates a diagram of operation waveforms of the display device of the embodiment of the present invention. In FIG. 3, an enable time period of the de-loading signal SGDL1 on the de-loading line GDL1 (a time period pulled up to high voltage) covers an enable time period (a time period pulled up to high voltage) of a gate driving signal SG1_E on the gate line G1_E. That is, before the pixel circuit 211 performs a charging operation of the display pixel, the transistor T2 is conducted based on the enabled de-loading signal SGDL first. Then, when the pixel circuit 211 performs the charging operation of the display pixel, the transistor T1 is conducted based on the enabled gate driving signal SG1_E. As such, merely the parasitic capacitance on the control end of the transistor T1 should be overcome by the enable operation based on the gate driving signal SG1_E, and the load is effectively reduced. The transistor T1 may be rapidly conducted and performs the charging operation of the display pixel.

In this embodiment, the pixels P11, P12, P21, P22 are coupled to the same de-loading line GDL1, whereas control ends of the transistors T1, T3, T5, T7 in the pixels P11, P12, P21, P22 are respectively coupled to the gate lines G1_E, G1_O, G2_O and G2_E. Control ends of the transistors T2, T4, T6, T8 in the pixels P11, P12, P21, P22 are commonly coupled to the de-loading signal SGDL1. The gate lines G1_E, G2_E may be an even number of the gate lines, and the gate lines G1_E, G2_E may be an odd number gate lines.

In operation details, based on the illustration of FIG. 3, the gate driving signals SG1_O, SG1_E, SG2_O, SG2_E on the gate lines G1_O, G1_E, G2_O, G2_E are enabled in sequence, and enable time periods of the gate driving signals SG1_O, SG1_E, SG2_O, SG2_E all include in the enable time period in the de-loading signal SGDL1. In addition, the pixel coupled to the odd number of the gate lines is alternatively arranged with the pixel coupled to the even number of the gate lines.

In this embodiment, the de-loading line GDL1 is coupled to a display row or the adjacent two display rows. A configuration relationship of the de-loading line GDL1, the gate lines G1_O, G1_E, G2_O, G2_E and the pixel circuits 211-222 may be disposed based on the actual needs of the designer. The illustration of FIG. 2 is merely an example for illustration, which is not used to limit the implementation scope of the invention.

Figure 4:
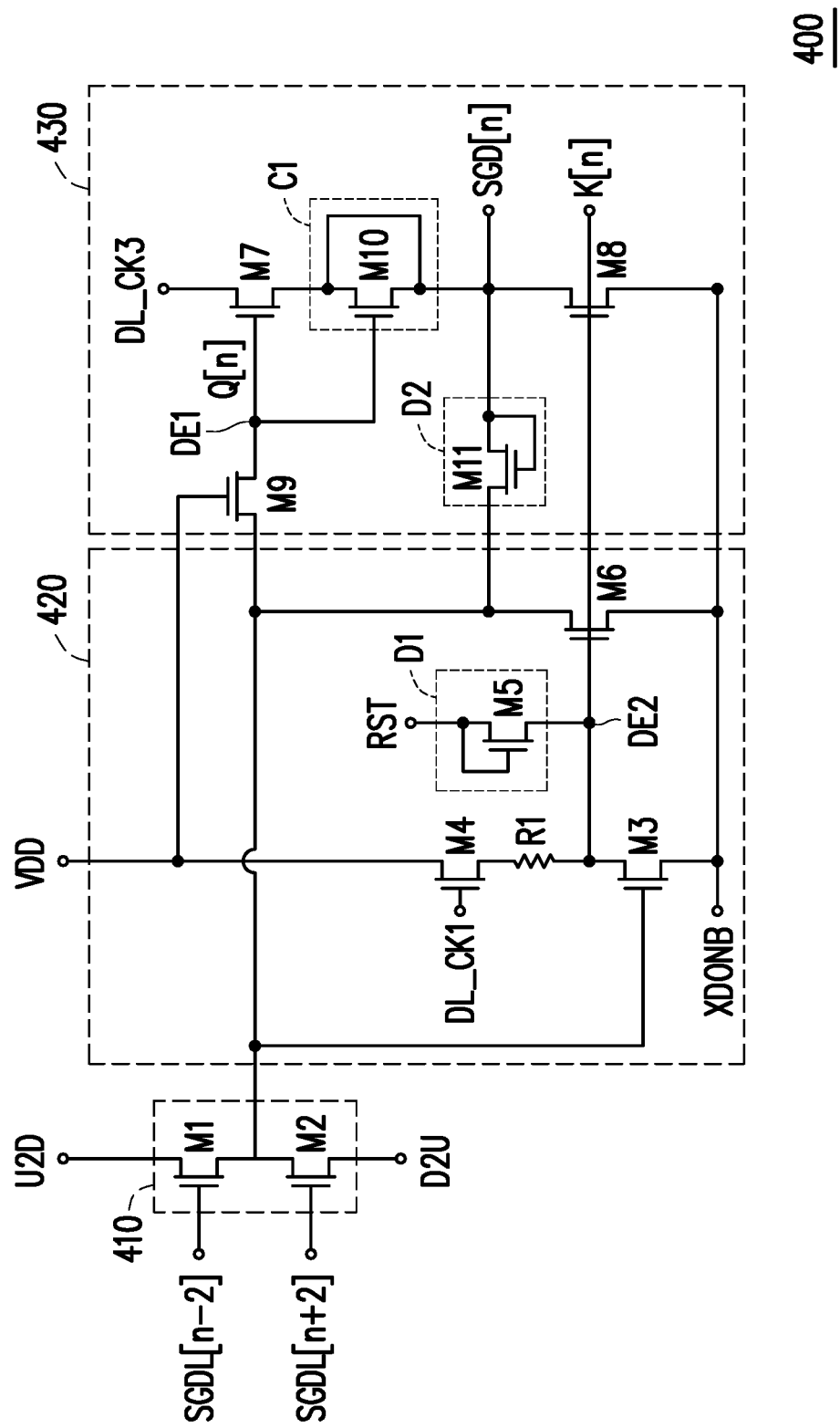
FIG. 4 illustrates a circuit schematic diagram of an Nth stage de-loading signal generating circuit of an embodiment of the invention.

In a generation method of the de-loading signal, in the embodiment of the invention, the de-loading signal may be provided by a de-loading signal generator. The de-loading signal generator include a plurality of de-loading signal generating circuits coupled in series. Regarding an Nth stage de-loading signal generating circuit, please refer to FIG. 4 illustrating a circuit schematic diagram of an Nth stage de-loading signal generating circuit of an embodiment of the invention. An Nth stage de-loading signal generating circuit 400 includes a voltage selector 410, a pull-down circuit 420 and an output-stage circuit 430. The voltage selector 410 provides a selecting signal SEL to a driving end DE1 to generate a driving signal Q[n] based on a prior stage de-loading signal SGDL[N−2] or a rear stage de-loading signal SGDL[N+2]. The pull-down circuit 420 is coupled to the voltage selector 410 and a driving end DE2, and generates a driving signal K[n] on the driving end DE2 based on the selecting signal SEL and a de-loading clock signal DL_CK1. The output-stage circuit 430 is coupled to the driving end DE1 and the driving end DE2. The output-stage circuit 430 generates a de-loading signal SGDL[N] based on the driving signal Q[n], the driving signal K[n] and a reverse de-loading clock signal DL_CK3.

In detail, the voltage selector 410 includes transistors M1 and M2. A first end of the transistor M1 receives a scan-direction selecting signal U2D. A second end of the transistor M1 is coupled to the driving end DE1 through a transistor M9. A control end of the transistor M1 receives the prior stage de-loading signal SGDL[N−2]. A first end of the transistor M2 receives a scan-direction selecting signal D2U. A second end of the transistor M2 is coupled to the first end of the transistor M1. A control end of the transistor M2 receives the rear stage de-loading signal SGDL[N+2]. The scan-direction selecting signal U2D may be arranged to indicate that a scanning operation of the display apparatus is performed from the top of the panel to the lower part of the panel. The scan-direction selecting signal D2U may be arranged to indicate that a scanning operation of the display apparatus is performed from the lower of the panel to the top part of the panel. Furthermore, the enable time periods of the prior stage de-loading signal SGDL[N−2] and the rear stage de-loading signal SGDL[N+2] are not overlapped.

One of the transistor M1 and M2 may be conducted based on the prior stage de-loading signal SGDL[N−2] or the rear stage de-loading signal SGDL[N+2]. When the transistor M1 is conducted based on the prior stage de-loading signal SGDL[N−2] (the transistor M2 unconducted), the voltage selector 410 selects the scan-direction selecting signal U2D to generate the selecting signal SEL. Relatively, when the transistor M2 is conducted based on the rear stage de-loading signal SGDL[N+2] (the transistor M1 unconducted), the voltage selector 410 selects the scan-direction selecting signal D2U to generate the selecting signal SEL.

The pull-down circuit 420 includes transistors M3-M6 and a resistor R1. A first end of the transistor M4 receives a power voltage VDD. A control end of the transistor M4 receives the de-loading clock signal D1_CK1. A second end of the transistor M4 is coupled to a first end of the resistor R1. The second end of the resistor R1 is coupled to the first end of the transistor M3, and is coupled to the driving end DE2. The control end of the transistor M3 receives the selecting signal SEL. A second end of the transistor M3 receives a reference voltage XDONB. In addition, a first end of the transistor M6 is coupled to the driving end DE1 through the transistor M9. A control end of the transistor M6 is coupled to the driving end DE2 to receive the driving signal K[n]. A second end of the transistor M6 receives the reference voltage XDONB. On the other hand, the transistor M5 is configured to be a diode D1 by a diode connection configuration. An anode of the diode D1 receives a reset voltage RST, and a cathode of the diode D1 is coupled to the driving end DE2. Here, the diode D1 forms a pull-up path, and maintains a fixed voltage value (approximately equal to the reset voltage RST minus the critical voltage of the transistor M5) of the driving signal K[n] when the transistor M3 is unconducted.

In this embodiment, the transistor M3 is conducted based on the selecting signal SEL. When the transistor M3 is conducted, the reference voltage XDONB having relative low voltage is provided to lower the voltage value of the driving signal K[n] on the driving end DE2. When the transistor M3 is unconducted, the transistor M4 and the resistor R1 form a pull-up path through the conducted transistor M4 to pull up the voltage value of the driving signal K[n] on the driving end DE2. When the voltage value of the driving signal K[n] is pulled up, the transistor M6 is conducted. The voltage value of the coupled endpoint of the transistor M9 and the transistor M6 is correspondingly pulled down, and the voltage value of the driving signal Q[n] is correspondingly pulled down.

In this embodiment, the output-stage circuit 430 includes transistors M7-M11. A first end of the transistor M7 receives the reverse de-loading clock signal DL_CK3. A control end of the transistor M7 receives the driving signal Q[n]. A second end of the transistor M7 is coupled to an output end of the Nth stage de-loading signal generating circuit 400. The transistor M7 pulls up the voltage value of the de-loading signal SGDL[N] when conducted based on the reverse de-loading clock signal DL_CK3. The transistor M10 forms a capacitor C1. One end of the capacitor C1 is coupled to the second end of the transistor M7. The other end of the capacitor C1 is coupled to the control end of the transistor M7. One end of the transistor M9 receives the selecting signal SEL. The other end of the transistor M9 is coupled to the driving end Q[n]. The control end of the transistor M9 receives the power voltage VDD, and the transistor M9 is substantially conducted.

Moreover, a first end of the transistor M8 is coupled to the output end of the Nth stage de-loading signal generating circuit 400. The second end of the transistor M8 receives the reference voltage XDONB, and the control end of the transistor M8 receives the driving signal K[n]. When the transistor M8 is conducted, the voltage value of the de-loading signal SGDL[N] is pulled down based on the reference voltage XDONB. The transistor M11 is coupled to a diode D2. An anode of the diode D2 is coupled to the first end of the transistor M8, and a cathode of the diode D2 is conducted to the first end of the transistor M6.

Figure 5:
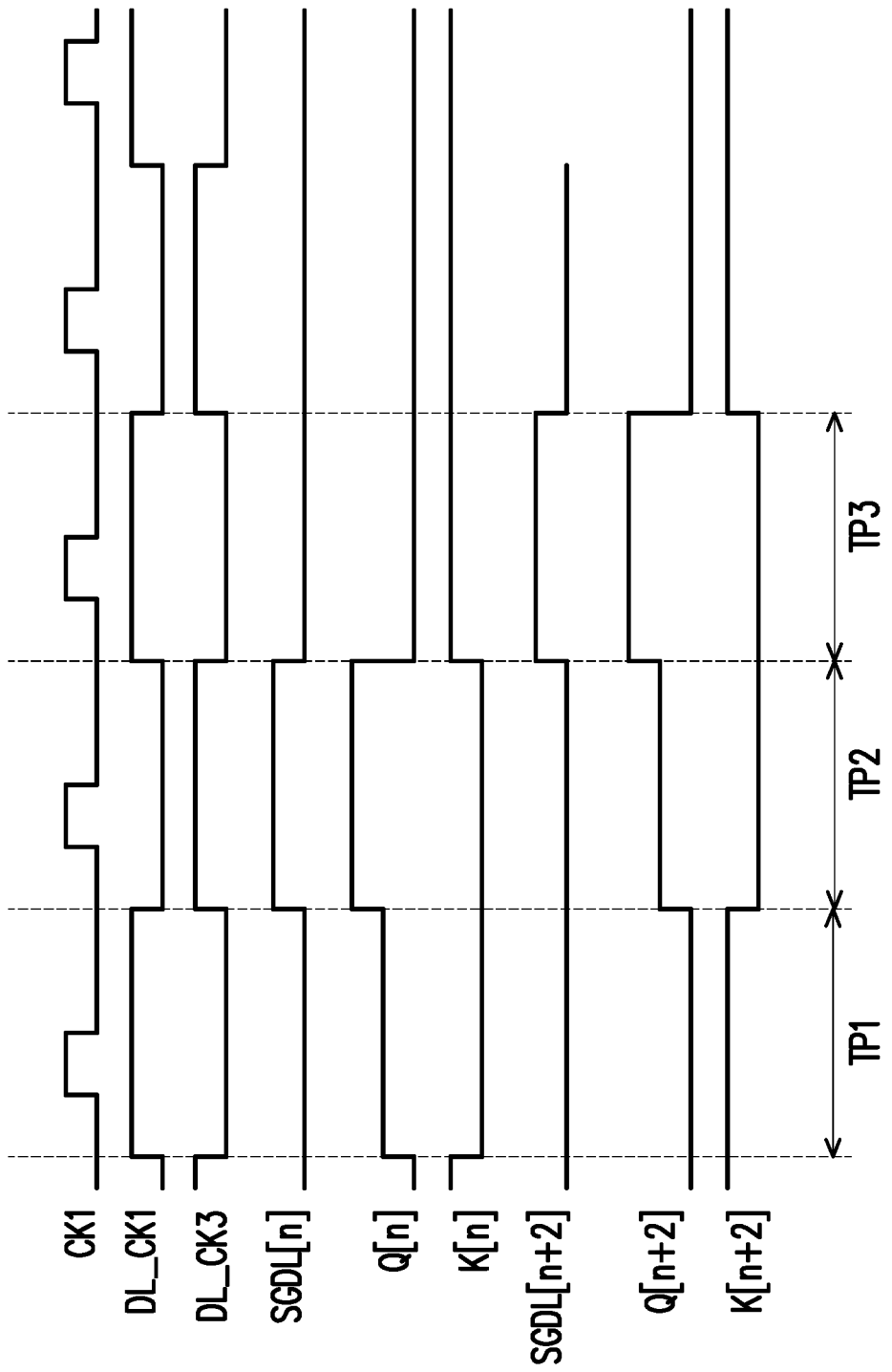
FIG. 5 illustrates a waveform diagram of a de-loading signal generating circuit of an embodiment of the invention.

Furthermore, please refer to FIG. 4 and FIG. 5 at the same time. FIG. 5 illustrates a waveform diagram of a de-loading signal generating circuit of an embodiment of the invention. The Nth stage de-loading signal generating circuit 400 performs based on a clock signal CK1.

In a time period TP1, the transistor M1 is conducted (the transistor M2 unconducted) and the scan-direction selecting signal U2D is selected to be equal to the high voltage value to generate the selecting signal SEL. Based on the transistor M9 being conducted, the voltage value of the driving signal Q[n] is correspondingly pulled up, and the transistor M7 is conducted. Meanwhile, since the voltage value of the reverse de-loading clock signal DL_CK3 is a low voltage value in the time period TP1, the voltage value of the de-loading signal SGDL[N] is maintained to be equal to the low voltage value. On the other hand, the transistor M3 is conducted based on the high voltage selecting signal SE, and the voltage of the driving signal K[n] is pulled down.

In a time period TP2, the voltage value of the reverse de-loading clock signal CL_CK3 is transited to high voltage value. As such, the voltage value of the de-loading signal SGDL[N] is correspondingly transited to high voltage value, and enters into the enable time period. Through a charge pump effect of the capacitor C1, the voltage value of the driving signal Q[n] is pumped up, and the transistor M7 is thus completely conducted.

In a time period TP3, the transistor M3 is conducted (the transistor M2 unconducted), the scan-direction selecting signal D2U is selected to be equal to the low voltage value to generate the selecting signal SEL. Based on the low voltage value selecting signal SEL, the transistor M3 is unconducted. In addition, in the time period TP3, the de-loading clock signal DL_CK3 is transited to high voltage level, and the transistor M4 is thus conducted. The driving signal K[n] on the driving end DE2 is correspondingly pulled up, and the transistors M6, M8 are thus conducted to pull down the voltage value of the driving signal Q[n] and the de-loading signal SGDL[N].

Since the de-loading signal generating circuit of an embodiment of the invention is implemented through a multi-level serial connection, the waveforms of rear stage driving signals K[n+2], Q[n+2] and a rear stage de-loading signal SGDL[N+2] in the N+2 stage de-loading signal generating circuit are the same as the waveforms of one cycle of the drive signals K[n], Q[n] and the de-loading signal SGDL[N] of the delayed clock signal CK1 in the Nth stage de-loading signal generating circuit.

Figure 6:
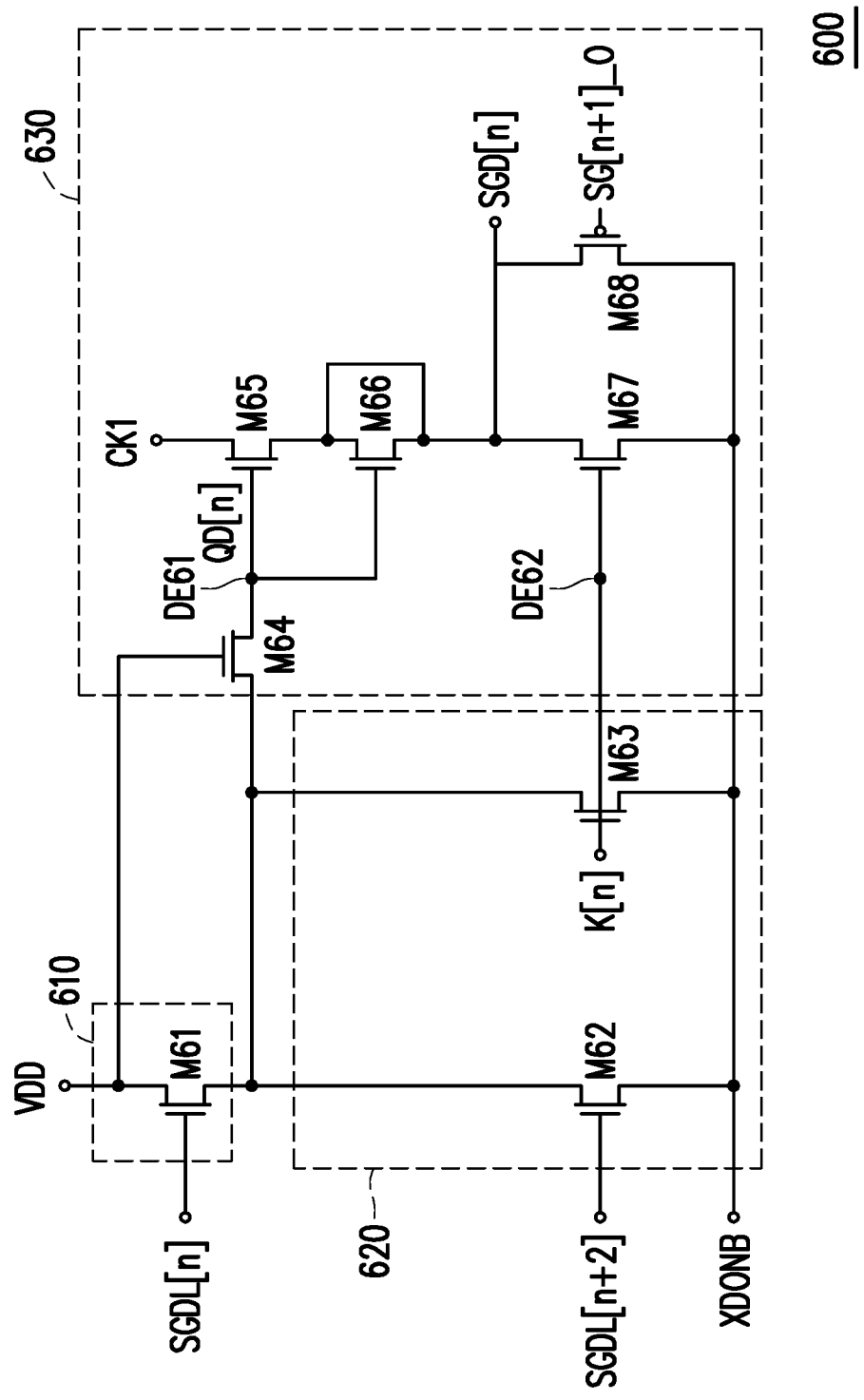
FIG. 6 illustrates a circuit schematic diagram of a shift register circuit of an embodiment of the invention.

Regarding the embodiment of the invention, the generating manner of the gate driving signal is provided through the gate driver. The gate driver includes a shift register having a plurality of shift register circuits coupled in series. Regarding the implementing details of the shift register circuit, please refer to FIG. 6 illustrating a circuit schematic diagram of a shift register circuit of an embodiment of the invention. An Nth stage shift register circuit 600 includes a pull-up circuit 610, a pull-down circuit 620, and an output-stage circuit 630. The pull-up circuit 610 is coupled to a driving end DE61. The pull-up circuit 610 pulls up the driving signal QD[n] on the driving end DE61 based on the de-loading signal SGDL[n]. The pull-down circuit 620 is coupled to the driving end DE61 to pull down the driving signal QD[n] on the driving end DE61 based on the rear stage de-loading signal SGDL[n+2] or the driving signal K[n]. The output-stage circuit 630 is coupled to the driving end DE61 and the driving end DE62, and the gate driving signal SG[n]_O is generated based on the driving signal K[n] or a rear stage gate driving signal SG[n+1]_O on the driving signal QD[n], and the driving end DE62.

In detail, the pull-up circuit 610 includes a transistor M61. The transistor M61 has a first end for receiving the power voltage VDD. A control end of the transistor M61 receives the de-loading signal SGDL[n]. A second end of the transistor M61 is coupled to the driving end DE61. The pull-down circuit 620 includes transistors M62, M63. The transistor M62 has a first end for being coupled to the driving end DE61. A second end of the transistor M62 receives the reference voltage XDONB. A control end of the transistor M62 receives the rear stage de-loading signal SGDL[n+2]. The transistor M62 has the first end coupled to the driving end DE61. The second end of the transistor M62 receives the reference voltage XDONB. A control end of the transistor M63 receives the driving signal K[n]. In this embodiment, the de-loading signal SGDL[n], the rear stage de-loading signal SGDL[n+2], the driving signal K[n] are from the corresponding de-loading signal generator. Based on the de-loading signal SGDL[n], the transistor M61 is conducted so as to pull up the voltage value of driving signal QD[n] on the driving end DE61. Based on the rear stage de-loading signal SGDL[n+2] and/or the driving signal K[n], the voltage value of the driving signal QD[n] on the driving end DE61 is pulled down the driving end DE61.

On the other hand, the output-stage circuit 630 includes transistors M64-M68. The transistor M65 has a first end to receive the clock signal CK1. A control end of the transistor M65 receives the driving signal QD[n]. A second end of the transistor M65 is coupled to output an end of the output-stage circuit 630. The transistor M66 forms a capacitor, and is coupled in series between the control end of the transistor M65 and the second end of the transistor M65. The transistor M67 has a first end coupled to the output end of the output-stage circuit 630. The second end of the transistor M67 receives the reference voltage XDONB. A control end of the transistor M67 receives the driving signal K[n]. The transistor M68 has a first end coupled to an output end of the output-stage circuit 630. A second end of the transistor M68 receives the reference voltage XDONB. A control end of the transistor M68 receives the rear stage gate driving signal SG[n+1]_O. Moreover, the transistor M64 is coupled to the path of the control end of the transistor M65 receiving the driving signal QD[n]. A control end of the transistor M64 receives the power voltage VDD, and is constantly conducted.

Figure 7:
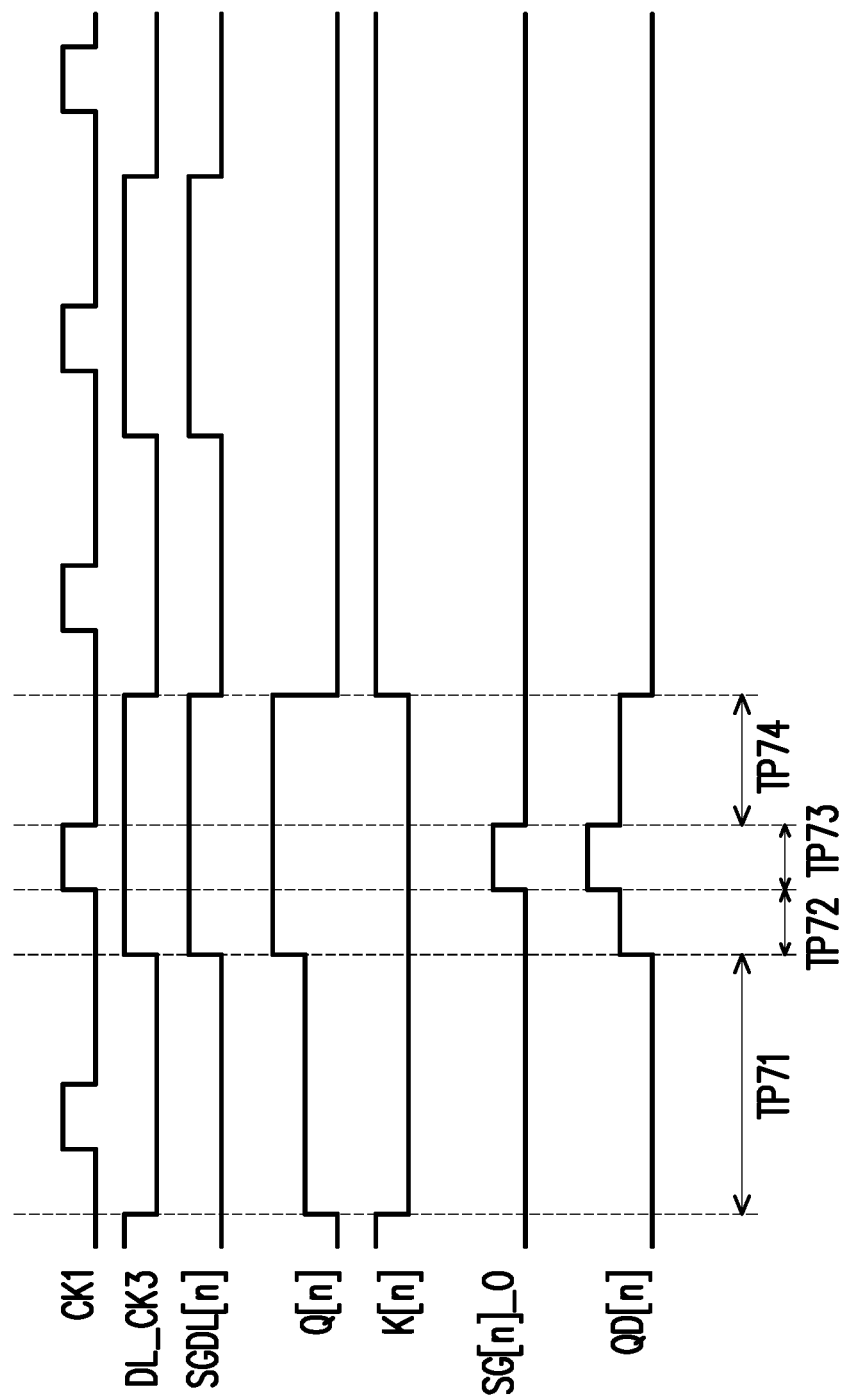
FIG. 7 illustrates a waveform diagram of a shift register circuit of an embodiment of the invention.

Regarding details of the operations, please refer to FIGS. 5, 6, and 7. FIG. 7 illustrates a waveform diagram of a shift register circuit according to an embodiment of the invention. In FIG. 7, a time period TP71 corresponds to the time period TP1 in FIG. 5, and time periods TP72-TP74 in FIG. 7 correspond to the time period TP2 in FIG. 5.

In this embodiment, in the time period TP71, the transistor M61 is unconducted based on the low voltage de-loading signal SGDL[n]. In the time period TP72, as the de-loading signal SGDL[n] is pulled up, the transistor M61 is conducted, and the voltage value of the driving signal QD[n] on the driving end DE61 is pulled up. As the voltage value of the driving signal QD[n] is pulled up, the transistor M65 is conducted, and the gate driving signal SG[n]_O is thus equal to the clock signal CK1. Afterwards, in the time period TP73, the clock signal CK1 is transited to high voltage value. Under the condition that the transistor M65 is maintained conducted, the voltage value of the gate driving signal SG[n]_O is pulled up and enters the enable time period. Furthermore, through the capacitor formed by the transistor M66, the voltage value of the driving signal QD[n] on the driving end DE61 is pumped up, and the transistor M65 is completely conducted. In the time period TP74, the clock signal CK1 is re-transited to low voltage value. The voltage value of the gate driving signal SG[n]_O is pulled down and the enabled period is ended. The voltage value of the driving signal QD[n] on the driving end DE61 is correspondingly pulled down.

According to the above, it is apparent that according to the aforementioned circuit design, the enable time period (time period TP72-TP74) of the de-loading signal SGDL[n] cover the enable time period (time period TP73) of the gate driving signal SG[n]_O so as to achieve the de-loading effect.

Figure 8:
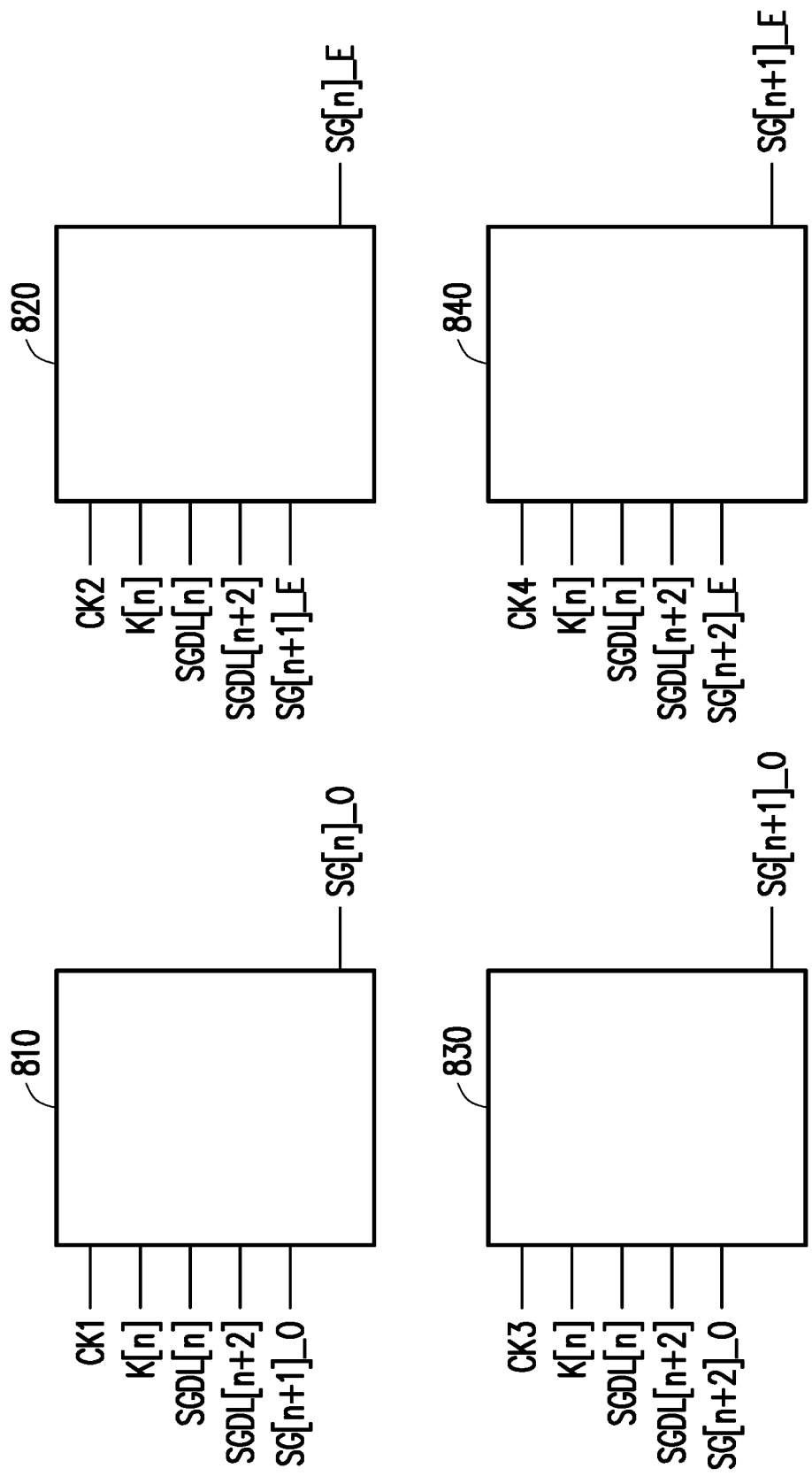
FIG. 8 illustrates a schematic diagram of a shift register circuit of an embodiment of the invention.

Please refer to FIG. 8. FIG. 8 illustrates a schematic diagram of a shift register circuit of an embodiment of the invention. The shift register 800 includes a plurality of shift register circuits 810-840. The shift register circuits 810, 820 are configured to respectively generate the Nth stage gate driving signals SG[n]_O and SG[n]_O. The shift register circuits 830, 840 are configured to respectively generate the N+1 stage rear stage gate driving signals SG[n+1]_O and SG[n+1]_E. The gate driving signal SG[n]_O and the rear stage gate driving signal SG[n+1]_O are configured to drive the odd gate lines of the Nth stage and N+1 stage. The gate driving signal SG[n]_E and the rear stage gate driving signal SG[n+1]_E are configured to drive the even gate lines of the Nth stage and N+1 stage.

It should be noted that the gate driving signals SG[n]_O, SG[n]_E, the rear stage gate driving signals SG[n+1]_O and SG[n+1]_E correspond to the same de-loading signal SGDL[n]. That is, the enable time period of the gate driving signal SG[n]_O, SG[n]_E, the rear stage gate driving signal SG[n+1]_O, and SG[n+1]_E all cover in the enable time period of the corresponding de-loading signal SGDL[n]. Hence, the shift register circuits 810-840 respectively receive (for example, receiving as the transistor M65 illustrated in FIG. 6) different phases of the clock signals CK1-CK4, the SG[n]_O, SG[n]_E, SG[n+1]_O and SG[n+1]_E having different phases that are generated in the enabled time period covering the de-loading signal SGDL[n]. The clock signals CK2-CK3 are generated in sequence based on the delayed time pulse signal CK1.

In summary of the above, the invention is respectively controlled by the gate driving signal and the de-load signal through the first transistor in the pixel circuit and the control end of the second transistor. In addition, before the display pixel is charged, the second transistor is conducted according to the de-loading signal. When the pixel is charged, the first transistor and the second transistor are simultaneously conducted. The aforementioned operations are achieved by enabling the enable time period of the de-loading signal to cover the enable time period of the gate driving signal. As such, the influence of conduction of the first transistor affected by the parasitic capacitor on the gate line may be reduced, and the display pixel has sufficient charging time.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A display apparatus, comprising:
a pixel array, comprising a plurality of display rows, each of the display rows comprising a plurality of pixel circuits, each of the pixel circuits comprising a first transistor and a second transistor coupled in series between a data line and a display pixel, wherein the second transistor is connected between the data line and the first transistor;
a plurality of gate lines, wherein a control end of the first transistor of each of the pixel circuits is coupled to one of the plurality of gate lines, and receives a gate driving signal; and
a plurality of de-loading lines, wherein a control end of the second transistor of each of the pixel circuits is coupled to one of the de-loading lines for receiving a de-loading signal,
wherein an enable time period of the de-loading signal received by each of the pixel circuits overlaps with an enable time period of the gate driving signal by each of the pixel circuits.

2. The display apparatus as claimed in claim 1, wherein the pixel circuits of the same display row comprise a plurality of first pixel circuits and a plurality of second pixel circuits, the gate lines comprise a first gate line and a second gate line, the first gate line is coupled to the first transistor of each of the first pixel circuits, the second gate line is coupled to the first transistor of each of the second pixel circuits.

3. The display apparatus as claimed in claim 2, wherein the first the pixel circuits are alternatively arranged with the second pixel circuits respectively.

4. The display apparatus as claimed in claim 2, further comprising:
a de-loading signal generator, coupled to the de-loading lines, for generating the de-loading signal on each of the de-loading lines.

5. The display apparatus as claimed in claim 4, wherein the de-loading signal generator comprises:
a plurality of de-loading signal generating circuits, the plurality of de-loading signal generating circuits coupled in series, wherein an Nth stage de-loading signal generating circuit comprises:
a voltage selector, providing a selecting signal to a first driving end to generate a first driving signal based on a prior stage de-loading signal or a rear stage de-loading signal;
a pull-down circuit, coupled to the voltage selector and a second driving end, generating a second driving signal on the second driving end based on the selecting signal and a de-loading clock signal; and
an output-stage circuit, coupled to the first driving end and the second driving end, generating the de-loading signal based on the first driving signal, the second driving signal and a reverse de-loading clock signal.

6. The display apparatus as claimed in claim 5, wherein the voltage selector comprises:
   a third transistor, having a first end receiving a first scan-direction selecting signal, a control end of the third transistor receiving the prior stage de-loading signal, a second end of the third transistor coupled to the first driving end; and
   a fourth transistor, having a first end receiving a second scan-direction selecting signal, a control end of the fourth transistor receiving the rear stage de-loading signal, a second end of the fourth transistor coupled to the first driving end,
   wherein one of the third transistor and the fourth transistor is conducted, one of the first scan-direction selecting signal and the second scan-direction selecting signal is provided to generate the selecting signal.

7. The display apparatus as claimed in claim 5, wherein the pull-down circuit comprises:
   a third transistor, having a first end receiving a power voltage, a control end of the third transistor receiving the de-loading clock signal;
   a resistor, having a first end coupled to a second end of the third transistor, a second end of the resistor coupled to the second driving end;
   a fourth transistor, having a first end coupled to the second driving end, a second end of the fourth transistor receiving a reference voltage, a control end of the fourth transistor receiving the selecting signal; and
   a fifth transistor, having a first end coupled to the first driving end, a second end of the fifth transistor receiving the reference voltage, a control end of the fifth transistor coupled to the second driving end.

8. The display apparatus as claimed in claim 7, wherein the pull-down circuit further comprises:
   a diode, where an anode of the diode receives a reset signal, and a cathode of the diode is coupled to the second driving end.

9. The display apparatus as claimed in claim 7, wherein the output-stage circuit comprises:
   a third transistor, having a first end receiving a reverse de-loading clock signal, a control end of the third transistor receiving the first driving signal, the second end of the third transistor coupled to an output end of the de-loading signal generator;
   a capacitor, connected in series between a control end of the third transistor and the second end of the third transistor;
   a diode, where an anode of the diode is coupled to the first driving end, a cathode of the diode is coupled to an output end of the de-loading signal generator; and
   a fourth transistor, having a first end coupled to an output end of the Nth stage de-loading signal generating circuit, a control end of the fourth transistor receiving the second driving signal, a second end of the fourth transistor receiving the reference voltage.

10. The display apparatus as claimed in claim 9, wherein the output-stage circuit further comprises:
    a fifth transistor, coupled to a path of the first driving signal received by the control end of the third transistor, the control end of the fifth transistor receiving the power voltage.

11. The display apparatus as claimed in claim 2, further comprising:
    a gate driver, coupled to the gate lines for generating the gate driving signal on each of the gate lines.

12. The display apparatus as claimed in claim 11, wherein the gate driver comprises:
    a plurality of shift register circuits, the shift register circuit coupled in series, the Nth stage shift register circuit comprising:
       a pull-up circuit, coupled to a first driving end to pull up a first driving signal on the first driving end based on the de-loading signal;
       a pull-down circuit, coupled to the first driving end to pull down the first driving signal on the first driving end based on a rear stage de-loading signal or a second driving signal; and
       an output-stage circuit, coupled to the first driving end and a second driving end to generate the gate driving signal based on the first driving signal, the second driving signal on the second driving end or a rear stage gate driving signal.

13. The display apparatus as claimed in claim 12, wherein the pull-up circuit comprises:
    a third transistor, having a first end receiving a power voltage, a control end of the third transistor receiving the de-loading signal, a second end of the third transistor coupled to the first driving end.

14. The display apparatus as claimed in claim 12, wherein the pull-down circuit comprises:
    a third transistor, having a first end coupled to the first driving end, a second end of the third transistor receiving a reference voltage, a control end of the third transistor receiving the rear stage de-loading signal; and
    a fourth transistor, having a first end coupled to the first driving end, a second end of the fourth transistor receiving the reference voltage, a control end of the fourth transistor receiving the second driving signal.

15. The display apparatus as claimed in claim 12, wherein the output-stage circuit comprises:
    a third transistor, having a first end receiving a clock signal, a control end of the third transistor receiving the first driving signal, a second end of the third transistor coupled to an output end of the output-stage circuit;
    a capacitor, coupled in series between a control end of the third transistor and a second end of the third transistor;
    a fourth transistor, having a first end coupled to the output end, a second end of the fourth transistor receiving the reference voltage, a control end of the fourth transistor receiving the second driving signal;
    a fifth transistor, having a first end coupled to the output end, a second end of the fifth transistor receiving the reference voltage, a control end of the fifth transistor receiving the rear stage gate driving signal; and
    a sixth transistor, coupled to a path of the first driving signal received by the control end of the third transistor, a control end of the sixth transistor receiving the power voltage.

* * * * *